(12) United States Patent
Zhang et al.

(10) Patent No.: US 9,502,127 B2
(45) Date of Patent: Nov. 22, 2016

(54) SYSTEM OPTIMIZATION IN FLASH MEMORIES

(71) Applicant: SK hynix memory solutions inc., San Jose, CA (US)

(72) Inventors: Fan Zhang, Fremont, CA (US); David J. Pignatelli, Saratoga, CA (US); June Lee, Sunnyvale, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 15/073,286

(22) Filed: Mar. 17, 2016

(65) Prior Publication Data

US 2016/0276036 A1    Sep. 22, 2016

Related U.S. Application Data

(60) Provisional application No. 62/134,375, filed on Mar. 17, 2015.

(51) Int. Cl.
*G11C 16/04*    (2006.01)
*G11C 16/26*    (2006.01)

(52) U.S. Cl.
CPC .................................. *G11C 16/26* (2013.01)

(58) Field of Classification Search
CPC ........................................................ G11C 16/04
USPC ........................................ 365/185.01–185.33
See application file for complete search history.

(56) References Cited

U.S. PATENT DOCUMENTS

| | | | |
|---|---|---|---|
| 8,914,696 B2* | 12/2014 | Chen | G06F 11/106 714/746 |
| 2014/0068365 A1* | 3/2014 | Chen | G06F 11/106 714/746 |
| 2014/0095110 A1* | 4/2014 | Chen | G11C 29/028 702/179 |
| 2014/0281771 A1 | 9/2014 | Yoon et al. | |

FOREIGN PATENT DOCUMENTS

KR    1020100111009    10/2010

* cited by examiner

*Primary Examiner* — Harry W Byrne
(74) *Attorney, Agent, or Firm* — IP & T Group LLP

(57) ABSTRACT

Methods of determining distributions may include performing a number of hard reads, performing a number of background reads at a frequency based on the number of hard reads, and estimating a conditional probability density of a cell voltage based on the hard reads and the background reads.

16 Claims, 5 Drawing Sheets

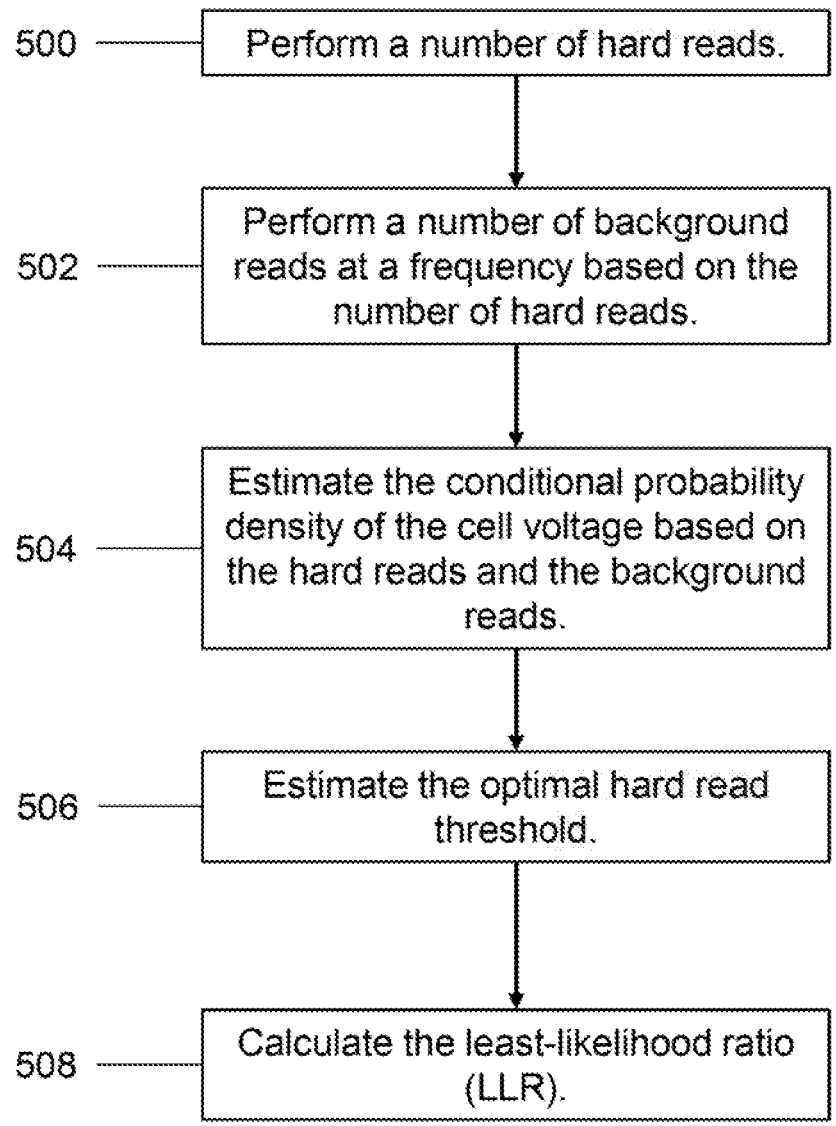

SYSTEM OPTIMIZATION IN FLASH MEMORIES

CROSS-REFERENCE TO RELATED APPLICATIONS

This application claims the benefit of U.S. Provisional Application No. 62/134,375 filed Mar. 17, 2015, the entire contents of which are incorporated herein by reference.

BACKGROUND

1. Field

Exemplary embodiments of the present disclosure relate to a memory controller and an operating method thereof.

2. Description of the Related Art

Semiconductor memory devices are generally classified into volatile memory devices, such as a dynamic random access memory (DRAM) and a static RAM (SRAM), and nonvolatile memory devices, such as a read only memory (ROM), a mask ROM (MROM), a programmable ROM (PROM), an erasable PROM (EPROM), an electrically EPROM (EEPROM), a ferromagnetic RAM (FRAM), a phase change RAM (PRAM), a magnetoresistive RAM (MRAM), a resistive RAM (RRAM) and a flash memory.

Volatile memory devices lose their stored data when their power supply is interrupted, whereas nonvolatile memory devices retain their data even without a constant source of power. Flash memory devices are widely used as a storage medium in computer systems because of their high program speed, low power consumption and large data storage capacity.

As capacities increase and size decreases, durability and reliability of flash memories are of concern. There exists a need for improved systems that increase the durability and reliability of flash memories.

SUMMARY

Aspects of the invention include methods of determining distributions. The methods may include performing a number of hard reads, performing a number of background reads at a frequency based on the number of hard reads, and estimating a conditional probability density of a cell voltage based on the hard reads and the background reads Additional aspects of the invention: include systems for determining distributions. The systems may include a controller suitable for performing a number of hard reads, performing a number of background reads at a frequency based on the number of hard reads, and estimating a conditional probability density of a cell voltage based on the hard reads and the background reads.

BRIEF DESCRIPTION OF THE DRAWINGS

FIG. 5 is a flowchart of steps for determining distributions according to aspects of the invention.

DETAILED DESCRIPTION

Figure 1:
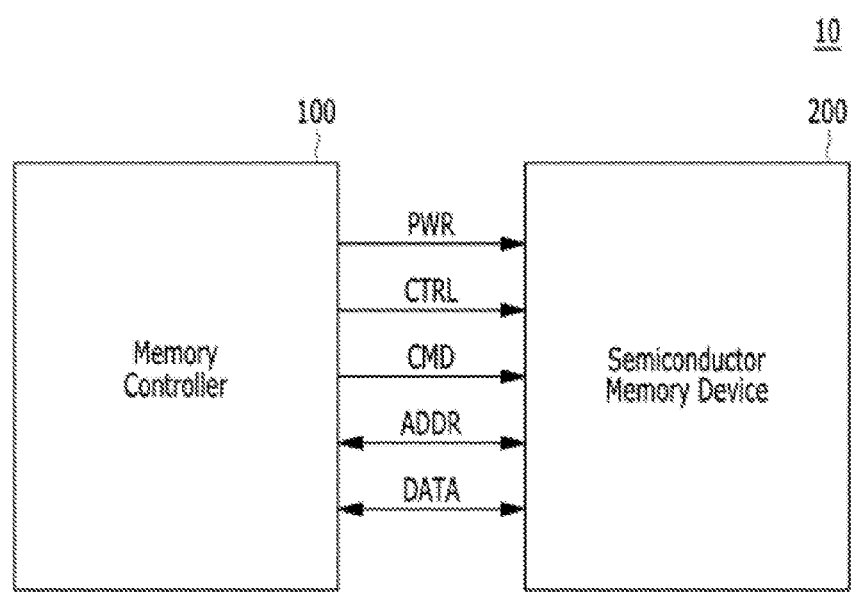
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
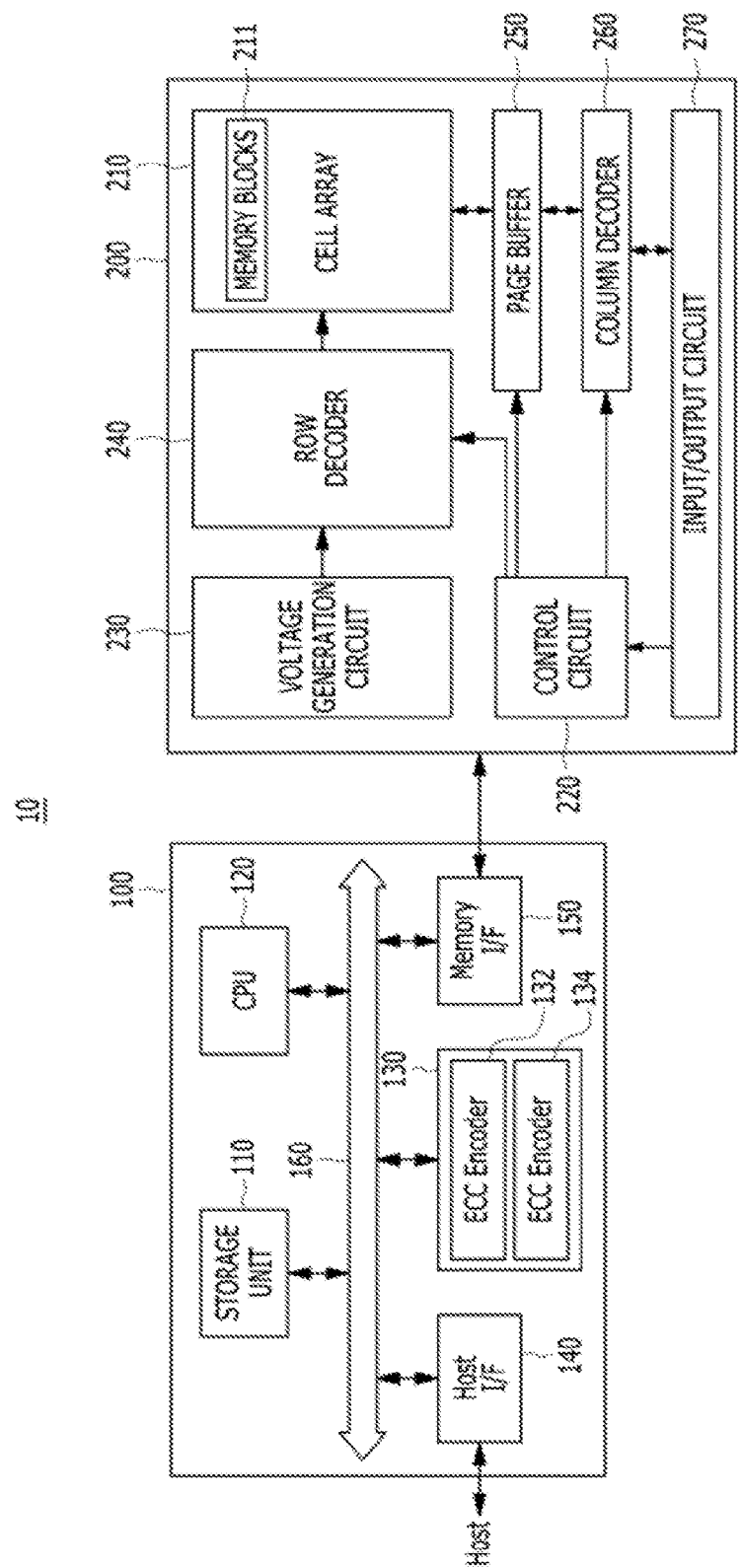
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may be the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as e a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a central processing unit (CPU) 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The CPU (or processor) 120 may control general operations of the memory system 10, and a write operation or a read operation for the memory device 200, in response to a write request or a read request from the host device. The CPU 120 may drive firmware, which is referred to as a flash translation layer (FTL), to control the general operations of the memory system 10. For example, the FTL may perform operations such as logical to physical (L2P) mapping, wear leveling, garbage collection, and bad block handling.

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits. The ECC unit 130 may include an ECC encoder 132 and an ECC decoder 134.

The ECC encoder 132 may perform error correction encoding on data to be programmed into the memory device 200 to output data to which parity bits are added. The parity bits may be stored in the memory device 200.

The ECC decoder 134 may perform error correction decoding on data read from the memory device 200. The ECC decoder 134 may determine whether the error correction decoding is successful, and may output an instruction signal based on the determination result. The ECC decoder 134 may correct error bits of data using parity bits generated by the ECC encoding.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
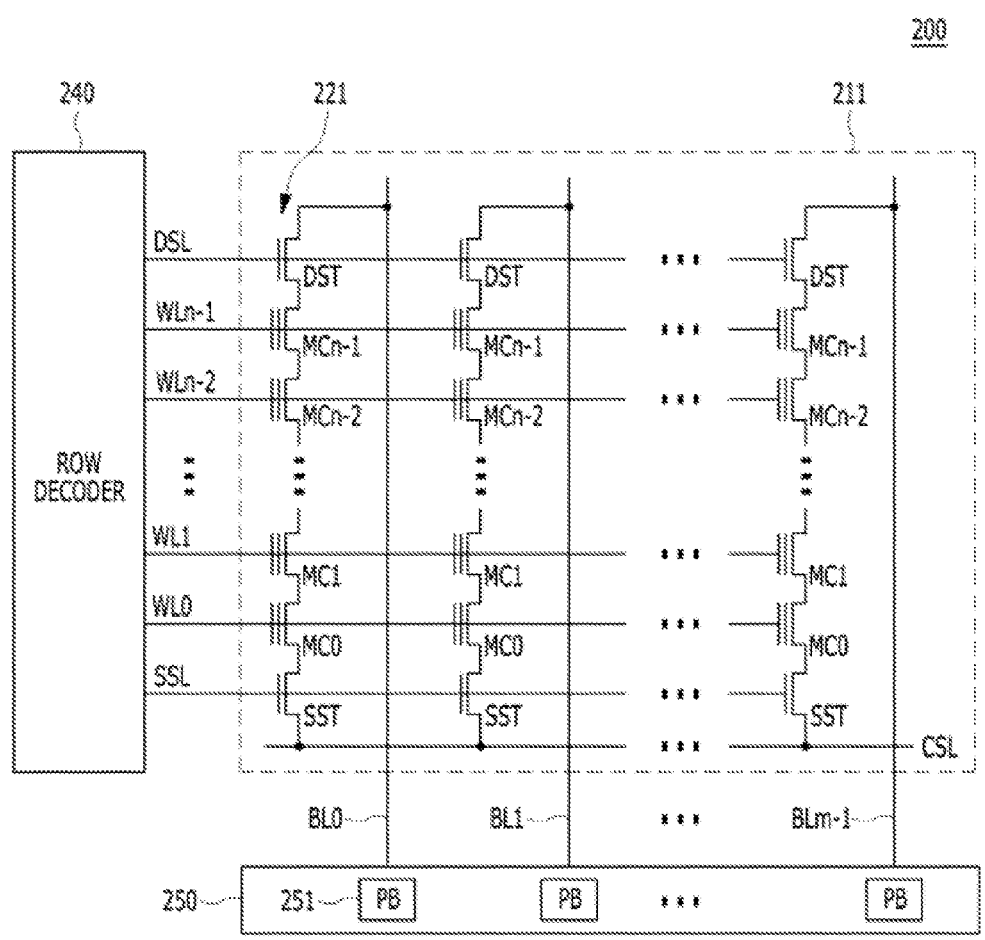
FIG. 3 is a circuit diagram illustrating a memory block of a semiconductor memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4A:
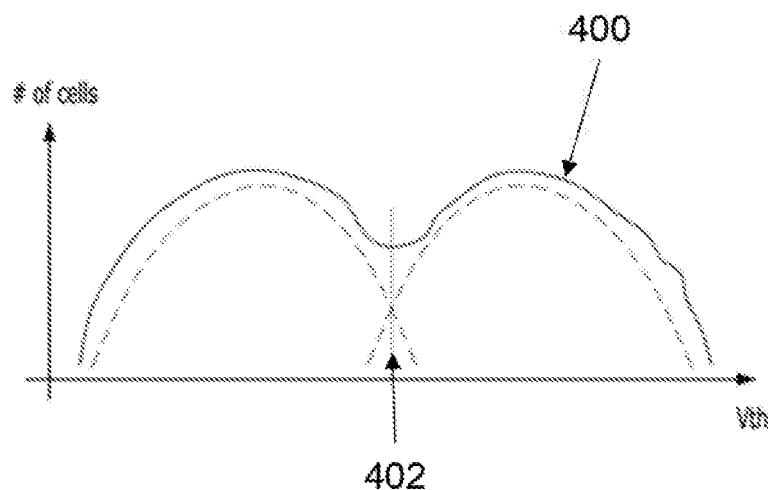
FIGS. 4A and 4B are graphs showing distributions according to aspects of the invention.
Figure 4B:
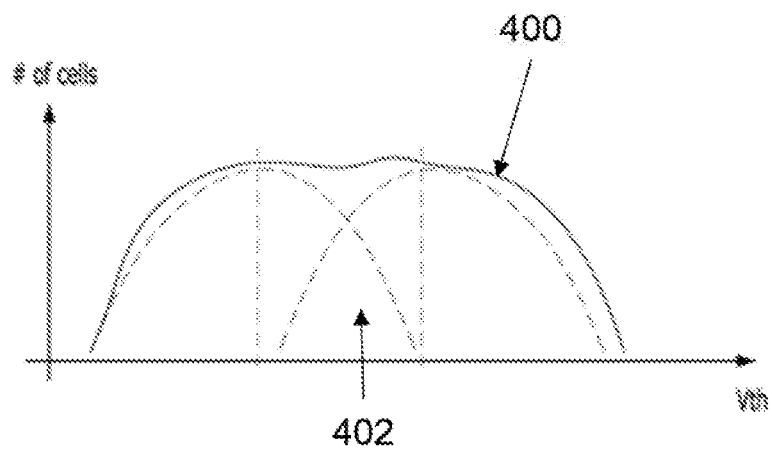

In NAND flash memory storage devices, information is stored in a cell by different charge levels in a cell. During write and read process, noise is introduced by program disturb and inter-cell interference charge leakage which cause the voltage level to drop over time, where the drop is proportional to the amount of charge stored as well as the number of program and erase (P/E) cycles a cell has experienced. Since the noise varies across cells, cells intended to be written to the same voltage level may end up exhibiting some voltage distribution when read back. Usually, the distribution from a higher intended voltage level will drift down and broaden as time passes due to the charge leaking effect, potentially overlapping a part of the distribution from a lower intended voltage level. For example, referring to FIGS. 4A and 4B, the distribution 400 may include an overlapping region 402, and this region 402 may become larger over time, leading to inaccurate distribution readings. This drifting and broadening phenomenon is more severe for smaller fabrication process nodes. Consequently, discerning cells that belong to a particular distribution becomes increasingly difficult as NAND flash memory vendors aggressively shrink the fabrication process nodes to increase storage density and reduce cost.

Many algorithms in controller and firmware depend on the precise knowledge of the underlying conditional distribution of cell levels. For example, the optimal hard-read threshold is the cross-point of two conditional distributions. For hard-read NAND flash memory storage devices, reading back the stored information involves comparing the cell voltage against a set of thresholds. In SLC devices, the read back value of a bit (either 0 or 1) is solely based on whether the cell voltage is above or below a single threshold. (The term "hard-read" refers to the fact that the read back values are either 0 or 1). This is in contrast to the term "soft-read", where the read back values can take on a range of numbers for representing the cell voltage in a fine resolution. The optimal thresholds used in soft-read, or least-likelihood ratio (LLR) generation, also depends on the knowledge of conditional distributions. From the distribution of cell levels, the health of the device may also be determined so that the optimal weal-leveling and programming parameters can be applied. In summary, cell-level distributions contain the complete statistical knowledge of NAND, which can help with optimization of systems.

The examples and embodiments disclosed herein includes methods, systems, devices, and processes for estimating cell level distributions. The knowledge of distributions may also be used in many algorithms to make statistically optimal decisions, thereby resulting in improved current error recovery flow (e.g., eBoost, LLR generation, etc.).

There exist major problems in error recovery flow that the invention disclosed herein addresses. For example, LLR generation does not adapt to the cell voltage distribution. Some pre-determined value will be assigned to cells whose voltage fall into certain interval. As NAND device ages, the cell level distribution may shift over time. Read disturbance and inter-cell interference will also change cell level distributions. Another example is that the eBoost is too slow for real time error recovery. Currently, when there is some uncorrectable error, eBoost will be applied so that the overall distribution can be (partially) learned by performing hard reads at different read threshold. When eBoost is finished, it is hoped to find a better hard read threshold for next hard read or soft read, but this is not always the case.

The invention disclosed herein removes certain functions (e.g., eBoost, LLR calculation, etc.) from the real-time error recovery algorithm, and utilizes other algorithms in the background to estimate/determine distributions. The examples described herein are performed on a single level cell (SLC) structure for illustration purposes only. The invention may be embodied on other structures (MLC, TLC, QLC, etc.) as will be understood to those of skill in the art from the description herein.

Referring to FIG. 5, a flowchart 50 of steps for determining distributions and performing other functions in the background is shown.

Generally, $p(y|x=1)$ ($p(y|x=0)$) is denoted as the conditional probability density function of cell voltage y given true data x being a 1 and 0. Without knowing true data x, it is impossible to estimate $p(y|x=1)$ and $p(y|x=0)$.

At step 500, a number of hard reads is performed. After performing the number of hard reads, most data should be successfully decoded, which means the true data x may be known after decoding. The number of hard reads may be a predetermined number, or a number based on the amount of hard reads needed to determine the true data.

At step 502, a number of background reads is performed at a frequency based on the number of hard reads. Although flowchart 50 shows step 500 and step 502 leading to step 504 in succession, it will be understood to those of skill in the art that steps 500 and 502 may be repeated as necessary or desired prior to proceeding to step 504. Background distribution tracking may be performed at a low frequency. For example, a background read may be performed once for every 100 hard reads, every 1000 hard reads, etc. Other frequencies may be used. In an embodiment, the frequency at which the number of background reads is performed is chosen to be at a sufficient ratio to the number of hard reads to lead to significant time-consumption savings. In embodiments involving super blocks, the distribution for different super blocks may be tracked separately because data in the same super block tend to have similar cell voltage distributions.

At step 504, the conditional probability density of the cell voltage is estimated based on the hard reads and the background reads (and also, may be based on the read thresholds). Based on the read threshold $[t_1, t_2, t_3, \ldots, t_m]$, and hard read results and the true data x, $p(y|x=1)$ and $p(y|x=0)$ may be estimated as followed:

The number of cells whose true data is 1 and cell-voltages fall into $[t_{i-1}, t_i]$ may be denoted as $a_i$. The number of cells whose true data is 0 and cell-voltages fall into $[t_{i-1}, t_i]$ may be denoted as $b_i$. The estimated conditional distributions may be calculated as:

$$\bar{p}\left(\frac{t_{i-1}+t_i}{2} \mid x=1\right) = \frac{a_i}{\sum_{i=1}^{m}(a_i+b_i)},$$

and $$\bar{p}\left(\frac{t_{i-1}+t_i}{2} \mid x=0\right) = \frac{b_i}{\sum_{i=1}^{m}(a_i+b_i)}.$$

The calculations above will be increasingly more accurate once there are more and more thresholds and more accumulated reads. In an embodiment, the counters may be truncated to avoid overflow.

With the above determined distribution estimations, the optimal hard read threshold may be estimated and/or the LLR value may be calculated without performing multiple hard reads during real-time error recovery (e.g., performed in the background, such as "background eBoost").

At step 506, the optimal hard read threshold may be estimated. The optimal hard read threshold may be estimated as the cross-point of $p(y|x=1)$ and $p(y|x=0)$ (e.g., the cross-point between the conditional probability density with a true data of 1 and the conditional probability density with a true data of 0).

At step 508, the LLR may be calculated. The LLR may be calculated as $$LLR = \log\left[\frac{p(y|x=1)}{p(y|x=0)}\right]$$

(e.g., the logarithm of the ratio of $p(y|x=1)$ to $p(y|x=0)$). In fixed point implementations, the LLR value may be quantized into fixed point values.

Thus, the methods, systems, devices, and processes disclosed herein moves time-consuming distribution estimation to the background so that on-line error recovery may be performed with short latency.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A method of determining distributions, comprising:
   performing a number of hard reads;
   performing a number of background reads at a frequency based on the number of hard reads; and
   estimating a conditional probability density of a cell voltage based on the hard reads and the background reads.

2. The method of claim 1, wherein the estimating step includes estimating the conditional probability density with a true data of 1 and estimating the conditional probability density with a true data of 0.

3. The method of claim 2, further comprising estimating an optimal hard read threshold.

4. The method of claim 3, wherein the optimal hard read threshold is estimated as a cross-point between the conditional probability density with a true data of 1 and the conditional probability density with a true data of 0.

5. The method of claim 3, wherein the estimating the optimal hard read threshold is performed as a background operation.

6. The method of claim 2, further comprising calculating a least-likelihood ratio (LLR).

7. The method of claim 6, wherein the LLR is calculated as the logarithm of a ratio of the conditional probability density with a true data of 1 to the conditional probability density with a true data of 0.

8. The method of claim 6, wherein the calculating the LLR is performed as a background operation.

9. A system for determining distributions, comprising:
a controller suitable for:
performing a number of hard reads;
performing a number of background reads at a frequency based on the number of hard reads; and
estimating a conditional probability density of a cell voltage based on the hard reads and the background reads.

10. The system of claim 9, wherein the estimating includes estimating the conditional probability density with a true data of 1 and estimating the conditional probability density with a true data of 0.

11. The system of claim 10, wherein the controller is further suitable for estimating an optimal hard read threshold.

12. The system of claim 11, wherein the optimal hard read threshold is estimated as a cross-point between the conditional probability density with a true data of 1 and the conditional probability density with a true data of 0.

13. The system of claim 11, wherein the controller is configured to estimate the optimal hard read threshold as a background operation.

14. The system of claim 9, wherein the controller is further suitable for calculating a least-likelihood ratio (LLR).

15. The system of claim 14, wherein the LLR is calculated as the logarithm of a ratio of the conditional probability density with a true data of 1 to the conditional probability density with a true data of 0.

16. The system of claim 14, wherein the controller is configured to calculate the LLR as a background operation.

* * * * *